United States Patent
Chen et al.

(10) Patent No.: US 10,515,853 B1
(45) Date of Patent: Dec. 24, 2019

(54) METHOD OF WAFER DICING

(71) Applicant: Winbond Electronics Corp., Taichung (TW)

(72) Inventors: Ching-Wei Chen, Taichung (TW); Cheng-Hong Wei, Taichung (TW); Shuo-Che Chang, Taichung (TW); Hung-Sheng Chen, Taichung (TW); Hsin-Hung Chou, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/215,584

(22) Filed: Dec. 10, 2018

(51) Int. Cl.
| | |
|---|---|
| *H01L 21/78* | (2006.01) |
| *H01L 23/544* | (2006.01) |
| *H01L 21/66* | (2006.01) |
| *H01L 21/3065* | (2006.01) |
| *H01L 21/683* | (2006.01) |
| *H01L 21/304* | (2006.01) |
| *H01L 21/784* | (2006.01) |

(52) U.S. Cl.
CPC ............ *H01L 21/78* (2013.01); *H01L 21/304* (2013.01); *H01L 21/3065* (2013.01); *H01L 21/6836* (2013.01); *H01L 21/784* (2013.01); *H01L 22/32* (2013.01); *H01L 23/544* (2013.01); *H01L 2221/68327* (2013.01); *H01L 2223/5446* (2013.01)

(58) Field of Classification Search
CPC ..... H01L 21/78; H01L 21/782; H01L 21/784; H01L 21/786; H01L 21/6836; H01L 21/3065; H01L 21/304; H01L 21/3043; H01L 22/32; H01L 23/544; H01L 2223/5446; H01L 2221/68327
See application file for complete search history.

(56) References Cited

U.S. PATENT DOCUMENTS

| | | | | |
|---|---|---|---|---|
| 5,024,970 A | * | 6/1991 | Mori | H01L 21/3043 148/DIG. 28 |
| 7,566,638 B2 | * | 7/2009 | Shizuno | H01L 21/6835 257/E21.001 |
| 7,955,955 B2 | * | 6/2011 | Lane | H01L 21/563 438/113 |
| 8,298,963 B2 | * | 10/2012 | Akiba | B28D 5/022 438/773 |
| 8,809,120 B2 | * | 8/2014 | Miccoli | B23K 26/032 438/113 |
| 2016/0240391 A1 | * | 8/2016 | Chen | H01L 23/49816 |
| 2018/0076088 A1 | * | 3/2018 | Sandoh | H01L 21/304 |

* cited by examiner

*Primary Examiner* — Michael M Trinh
(74) *Attorney, Agent, or Firm* — JCIPRNET

(57) ABSTRACT

A method of wafer dicing is provided. The method of wafer dicing includes: providing a wafer, wherein the wafer includes a substrate, dies formed in and over the substrate and a scribe line structure located in a scribe line region between adjacent dies; removing a portion of the scribe line structure around a test device in the scribe line structure; attaching a front side of the wafer with a first tape; removing a portion of the substrate overlapping with the scribe line region from a back side of the wafer; attaching the back side of the wafer with a second tape; and removing the first tape along with the remaining portion of the scribe line structure attached thereon, leaving the dies separately attached on the second tape.

10 Claims, 17 Drawing Sheets

METHOD OF WAFER DICING

BACKGROUND

Technical Field

The present invention is related to a method of wafer dicing, and more particularly, to a method of wafer dicing that removes a scribe line structure in multiple steps.

Description of Related Art

As the critical dimension of semiconductor devices continuously shrinks, more dies can be formed on a single wafer. Accordingly, it takes much longer time for wafer dicing by applying a mechanical dicing process, such as a laser dicing or a blade dicing. As a result, manufacturing cost of the semiconductor devices is raised as the critical dimension of the semiconductor devices shrinks. Process time of wafer dicing can be effectively reduced by applying a plasma dicing process. However, when test devices (i.e., test element group, TEG) disposed in scribe lines contain the material that is not dry-etchable or would produce a barely etchable byproduct, the plasma dicing process may be impeded. For instance, the above-mentioned material includes Al. Furthermore, an additional solution process may be required for removing the above-mentioned byproduct, thus rendering the dies damaged.

SUMMARY

Accordingly, the present invention provides a method of wafer dicing that may avoid from directly etching the test device containing a barely etchable material.

The method of wafer dicing in some embodiments of the present invention comprises: providing a wafer, wherein the wafer comprises a substrate, a plurality of dies formed in and over the substrate and a scribe line structure, the scribe line structure is disposed in a scribe line region between adjacent dies, the scribe line structure comprises at least one insulating layer formed over the substrate and a test device formed in the at least one insulating layer; removing a portion of the at least one insulating layer that is surrounding the test device; attaching a front side of the wafer with a first tape, wherein the first tape is in contact with the plurality of dies and a remained portion of the at least one insulating layer; removing a portion of the substrate that is overlapped with the scribe line region from a back side of the wafer; attaching the back side of the wafer with a second tape; and removing the first tape along with the remained portion of the at least one insulating layer and the test device attached to the first tape, such that the plurality of dies are separately attached to the second tape.

In some embodiments, a method of removing the portion of the at least one insulating layer that is surrounding the test device comprises a lithography process and an etching process.

In some embodiments, before the front side of the wafer is attached with the first tape, the method of wafer dicing further comprises: attaching a grinding tape to the front side of the wafer; thinning the substrate from the back side of the wafer; and removing the grinding tape.

In some embodiments, before the grinding tape is removed, the method of wafer dicing further comprises: attaching the back side of the wafer with a tape.

In some embodiments, after the front side of the wafer is attached with the first tape, the method of wafer dicing further comprises: removing the tape.

In some embodiments, the tape and the first tape are connected to the same frame.

In some embodiments, a method of removing the portion of the substrate that is overlapped with the scribe line region from the back side of the wafer comprises: forming a photoresist layer on the back side of the wafer; patterning the photoresist layer, to form an opening in the photoresist layer, wherein the opening is overlapped with the scribe line region; removing the portion of the substrate that is exposed via the opening by using the patterned photoresist layer as a mask; and removing the patterned photoresist layer.

In some embodiments, a method of removing the portion of the substrate comprises a plasma dicing process.

In some embodiments, the test device comprises Al.

In some embodiments, the first tape and the second tape are connected to the same frame.

As above, the wafer dicing method of the embodiments in the present invention includes removing the scribe line structure in the scribe line region of the wafer in multiple stages. The scribe line structure is disposed on the substrate, and located between adjacent dies. In a first stage, the portion of the scribe line structure located in the peripheral region, which is surrounding the central region having the test device therein, is removed. Afterwards, in a second stage, the portion of the substrate that is overlapped with the whole scribe line region is removed. Since the portion of the scribe line structure located in the peripheral region and the portion of the substrate overlapped with the whole scribe line region are removed, the remained portion of the scribe line structure (i.e., the portion of the scribe line structure in the central region) can be disconnected from the dies. At this stage, the remained portion of the scribe line structure is merely attached to the tape, but not directly connected with the dies. Eventually, in the third stage, the tape is removed along with the remained portion of the scribe line structure attached to the tape. Therefore, the wafer dicing method of the embodiments in the present invention can avoid from directly removing the test device that may contain the barely etchable metal. Accordingly, the wafer dicing method of the embodiments in the present invention can be suitable for plasma dicing. A process time for singulating the dies by plasma dicing is significantly shorter than a process time for singulating the dies by laser dicing or mechanical dicing. Thus, a manufacturing cost can be greatly lowered.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
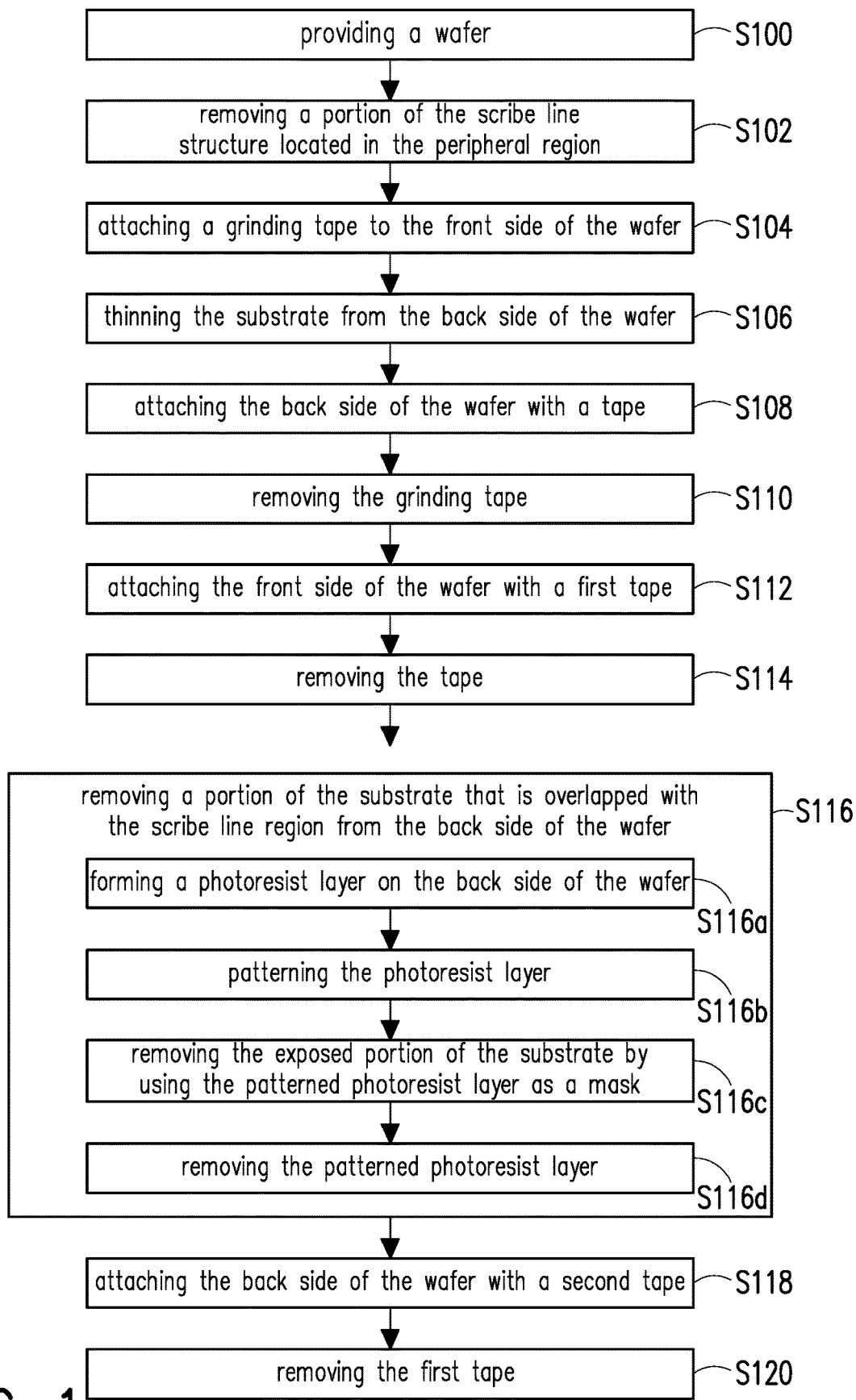
FIG. 1 is a process flow diagram of a method of wafer dicing according to some embodiments of the present invention.
Figure 2A:
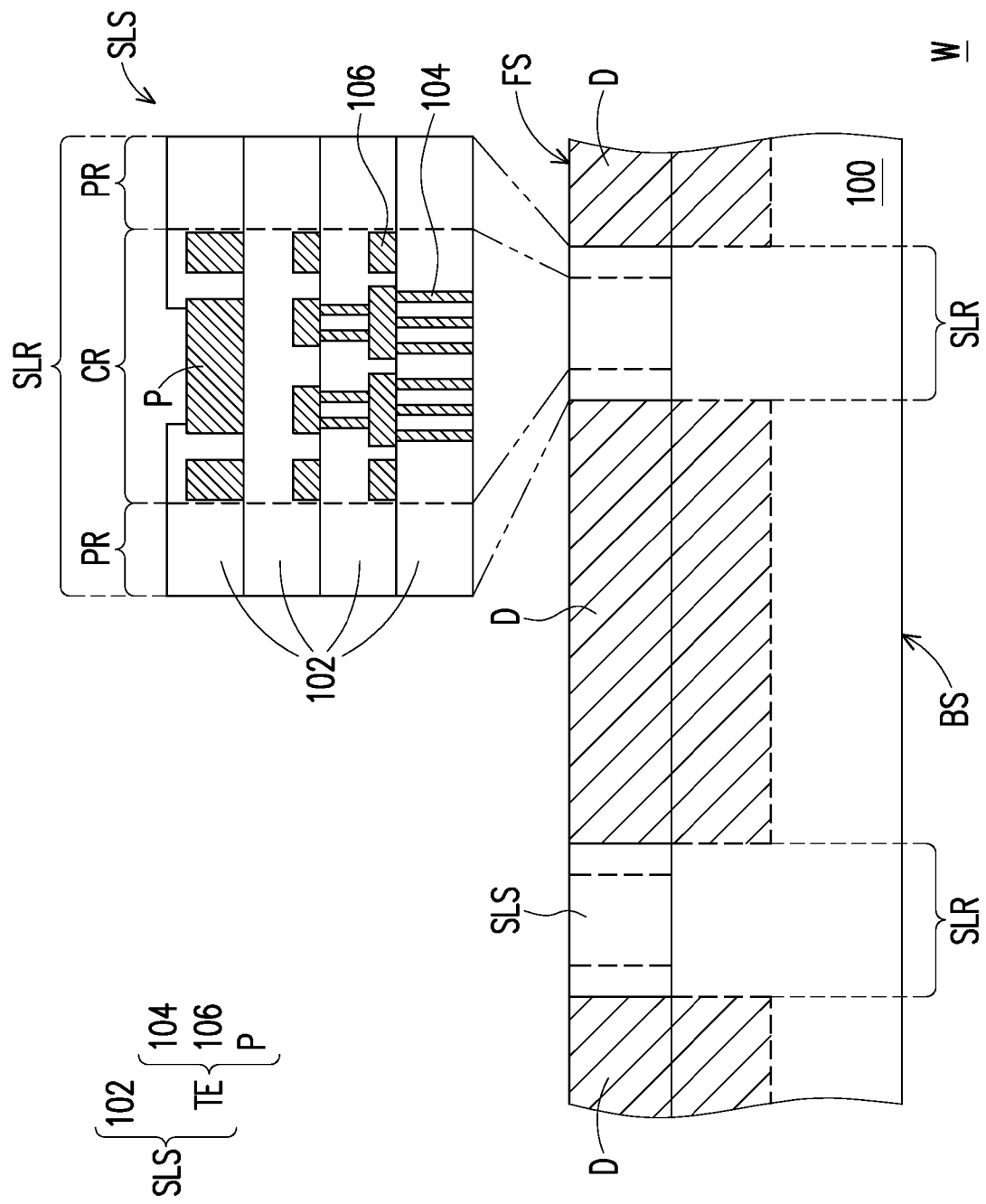
FIG. 2A through FIG. 2P are schematic cross-sectional views of structures at various stages of the method of wafer dicing shown in FIG. 1.

FIG. 1 is a process flow diagram of a method of wafer dicing according to some embodiments of the present invention. FIG. 2A through FIG. 2P are schematic cross-sectional views of structures at various stages of the method of wafer dicing shown in FIG. 1.

Referring to FIG. 1 and FIG. 2A, step S100 is performed, and a wafer W is provided. The wafer W includes a substrate 100 and a plurality of dies D. In some embodiments, the substrate 100 may be a semiconductor substrate or a semiconductor-on-insulator (SOI) substrate. A semiconductor material of the semiconductor substrate and the SOI substrate may include an elemental semiconductor or an alloy semiconductor. For instance, the elemental semiconductor may include Si or Ge. The alloy semiconductor may include SiGe, SiC, SiGeC, a group III-V semiconductor material or a group II-VI semiconductor material. In some embodiments, the substrate 100 may be doped, and have a first conductive type or a second conductive type complementary to the first conductive type. For instance, the first conductive type may be N type, and the second conductive type may be P type. The die D is formed on the substrate 100, and a portion of the die D may extend into the substrate 100. The die D may include integrated circuits containing active devices and passive devices. In some embodiments, the integrated circuits may include a logic circuit, a memory circuit, an analog device circuit, the like or combinations thereof. For conciseness, these integrated circuits are not shown in FIG. 2A through FIG. 2P. In some embodiments, the integrated circuits in the dies D may be the same as one another. In other embodiments, the integrated circuits in the dies D may be different from each other. In addition, each die D may further includes a seal ring (not shown). The seal ring surrounds the integrated circuits, so as to absorb stress and protect the integrated circuits during a dicing process performed on the wafer W.

The wafer W further includes a scribe line structure SLS. The scribe line structure SLS is disposed in a scribe line region SLR between adjacent dies D. In some embodiments, a width of the scribe line region SLR ranges from 60 µm to 80 µm. In some embodiments, the scribe line regions SLR among the dies D are communicated with one another, so as to be a continuous region. The scribe line structure SLS includes one or more insulating layers 102. In some embodiments of which the scribe line structure SLS includes multiple insulating layers 102, the insulating layers 102 are stacked on the substrate 100. For instance, a material of the insulating layer 102 may include silicon oxide, silicon nitride, a polymer or combinations thereof. In addition, the scribe line structure SLS further includes a test device TE. The test device TE is formed in the insulating layers 102, and located in a central region CR of the scribe line region SLR. A peripheral region PR of the scribe line region SLR is located between the central region CR and an adjacent die D, and the test device TE is absent in the peripheral region PR. In other words, the peripheral region PR of the scribe line region SLR may merely include the insulating layers 102. In some embodiments, a width of the central region CR may range from 56 µm to 76 µm, and a width of the peripheral region PR may be greater than 2 µm.

In some embodiments, the test device TE may include a plurality of conductive vias 104 and a plurality of traces 106. Each of the conductive vias 104 penetrates one of the insulating layers 102. Each of the traces 106 extends over one of the insulating layers 102, and is electrically connected with at least one of the conductive vias 104. In some embodiments, the test device TE further includes pads P. The pad P is formed in the topmost insulating layer 102, and electrically connected with the topmost conductive via 104. In some embodiments, the traces 106 and the pads P are composed by a metal material, and this metal material is not likely to be removed by a dry etching process or may produce a barely removable byproduct in the dry etching process. For instance, a material of the traces 106 and the pads P may include Al or Al alloy. In addition, a material of the conductive vias 104 may include W.

Referring to FIG. 1 and FIG. 2B through FIG. 2D, step S102 is performed, and a portion of the scribe line structure SLS that is located in the peripheral region PR is removed. In some embodiments, the portion of the scribe line structure SLS that is located in the peripheral region PR does not contain the test device TE, but merely contain a portion of the stack structure constituting the insulating layers 102. In other words, in step S102, a portion of the insulating layers 102 that is located in the peripheral region PR is removed.

Figure 2B:
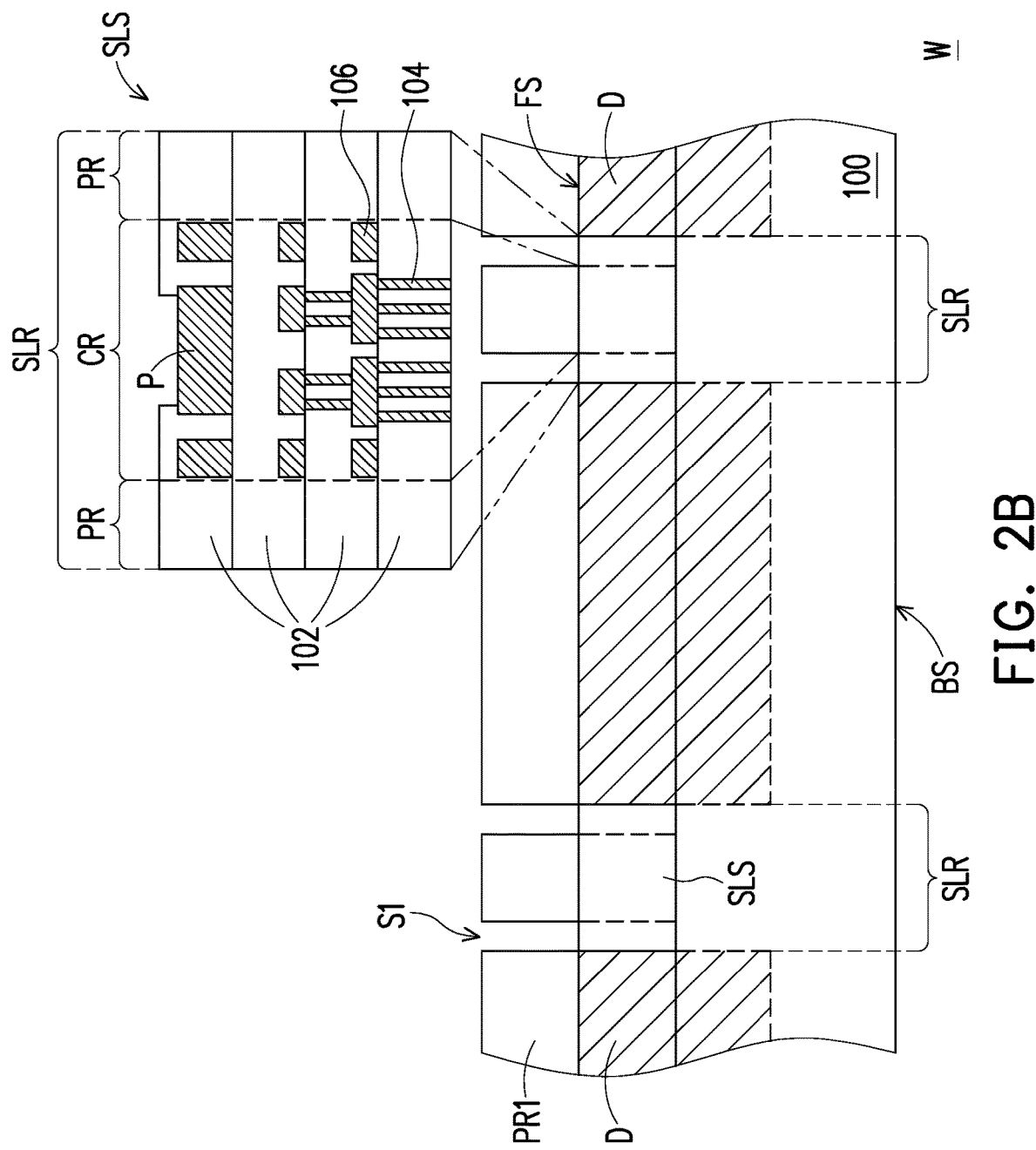

Referring to FIG. 2B, a method of removing the portion of the scribe line structure SLS that is located in the peripheral region PR may include forming a photoresist material layer (not shown) over the wafer W. Substantially the whole wafer W is covered by the photoresist material layer. Thereafter, this photoresist material layer is patterned via a lithography process, so as to form a photoresist layer PR1 having an opening S1. A portion of the scribe line structure SLS located in the peripheral region PR is exposed by the opening S1.

Figure 2C:
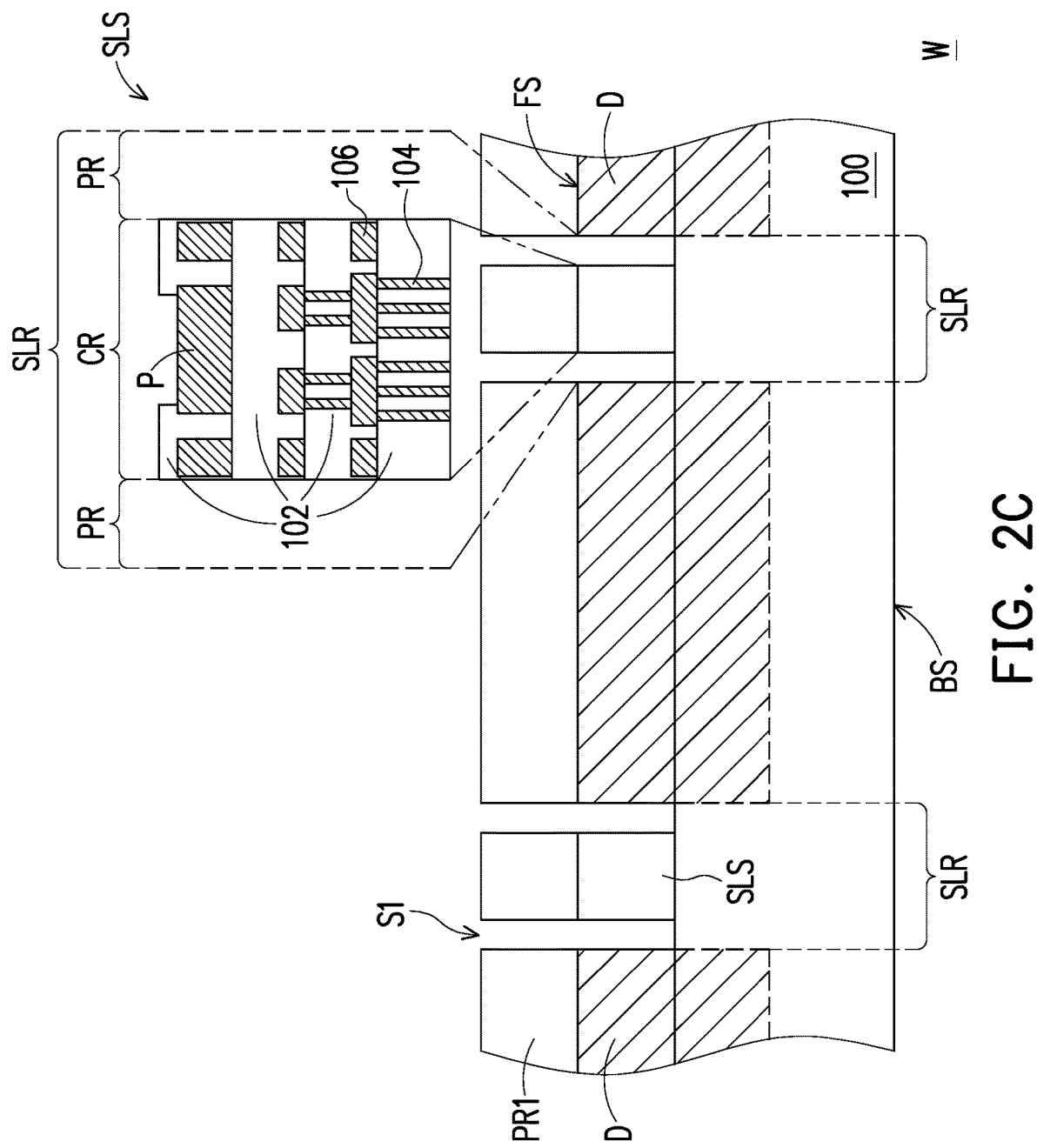

Referring to FIG. 2C, the exposed portion of the scribe line structure SLS is removed by using the photoresist layer PR1 as a mask. In other words, the portion of the scribe line structure SLS in the peripheral region PR is removed, whereas the portion of the scribe line structure SLS located in the central region CR is remained. As such, a gap is formed between the remained portion of the scribe line structure SLS and adjacent dies D. In some embodiments, a method of removing the portion of the scribe line structure SLS located in the peripheral region PR may include an anisotropic etching process, such as a dry etching process. Since the test device TE is absent in the peripheral region PR, the peripheral region PR may be free of the material (e.g., Al) that would impede an etching process. Therefore, the portion of the scribe line structure SLS in the peripheral region PR can be successfully removed by the etching process. In some embodiments, the substrate 100 may be functioned as an etching stop layer for this etching process. In alternative embodiments, a process time of this etching process may be adjusted, in order to remove substantially the whole portion of the scribe line structure SLS located in the peripheral region PR.

Figure 2D:
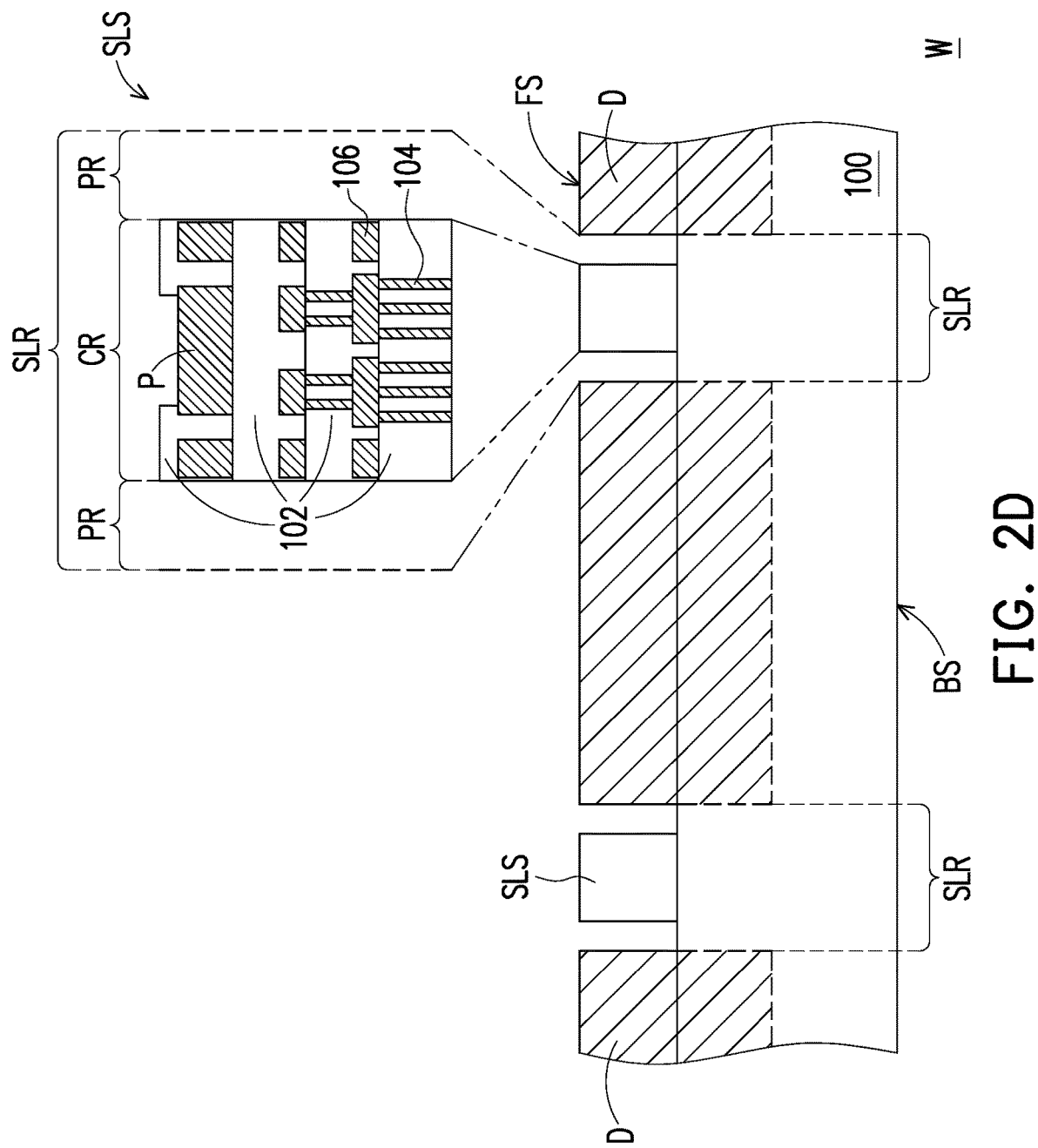

Referring to FIG. 2D, the photoresist layer PR1 is removed. As such, a front side FS of the wafer W can be exposed. That is, surfaces of the dies D and the remained portion of the scribe line structure SLS are exposed. In some embodiments, a method of removing the photoresist layer PR1 may include an ashing process. For instance, a reactive gas for the ashing process includes $O_2$. In other embodiments, the photoresist layer PR1 may be removed by a solution process.

Figure 2E:
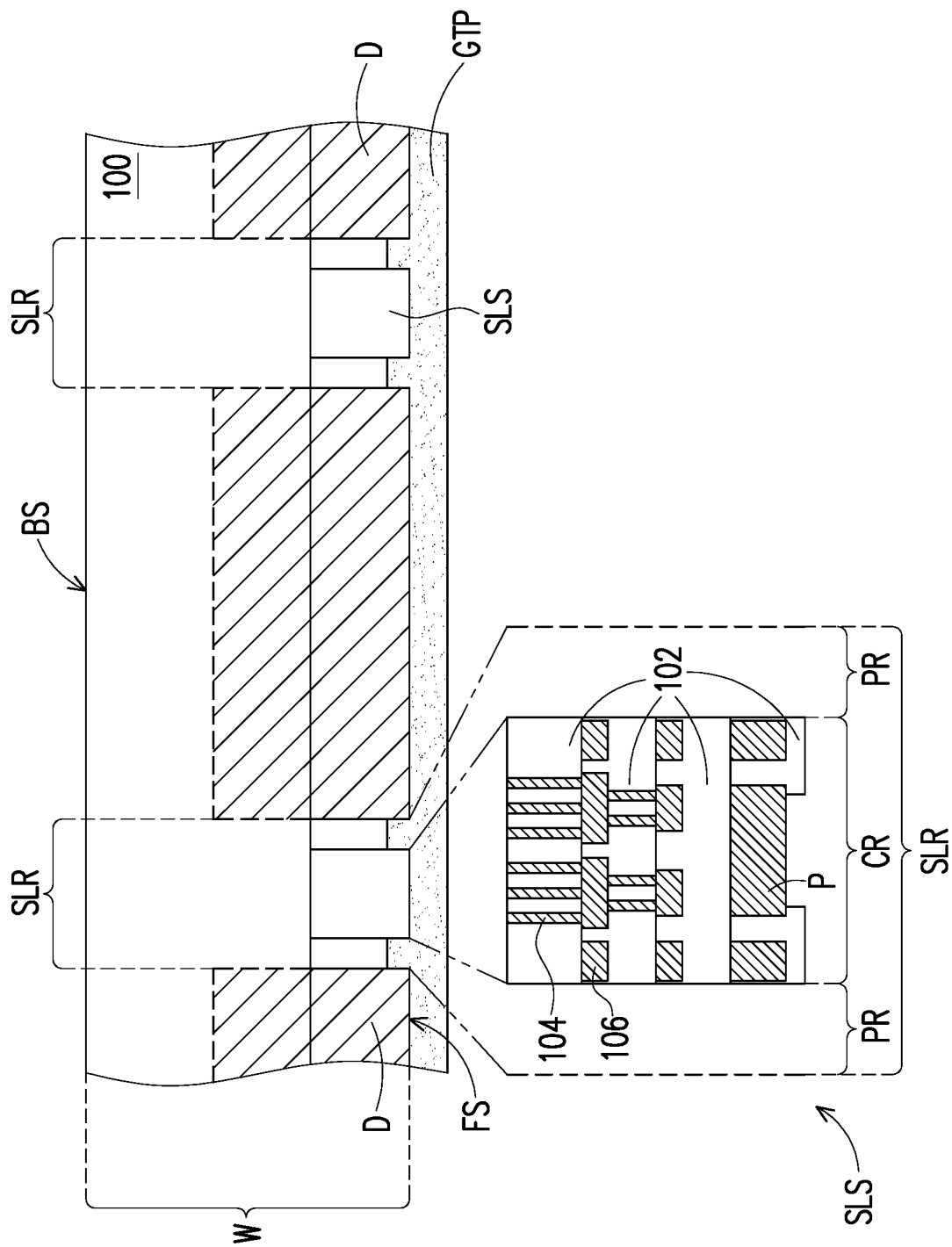

Referring to FIG. 1 and FIG. 2E, in some embodiments, step S104 is performed, and a grinding tape GTP is attached to the front side FS of the wafer W. The front side FS of the wafer W is referred as the surfaces of the dies D and the scribe line structure SLS, and a back side BS of the wafer W is referred as the surface of the substrate 100 opposite to the dies D and the scribe line structure SLS. In some embodiments, the grinding tape GTP is attached to the front side FS of the wafer W after the structure shown in FIG. 2D is turned upside down. In some embodiments, the grinding tape GTP can be more closely adhered to the front side FS of the wafer W by a method such as lamination. In some embodiments, the grinding tape GTP may extend into the gap between the dies D and the remained portion of the scribe line structure SLS, so as to partially fill the gap. In alternative embodiments, the grinding tape GTP may substantially fill up the above-mentioned gap.

Figure 2F:
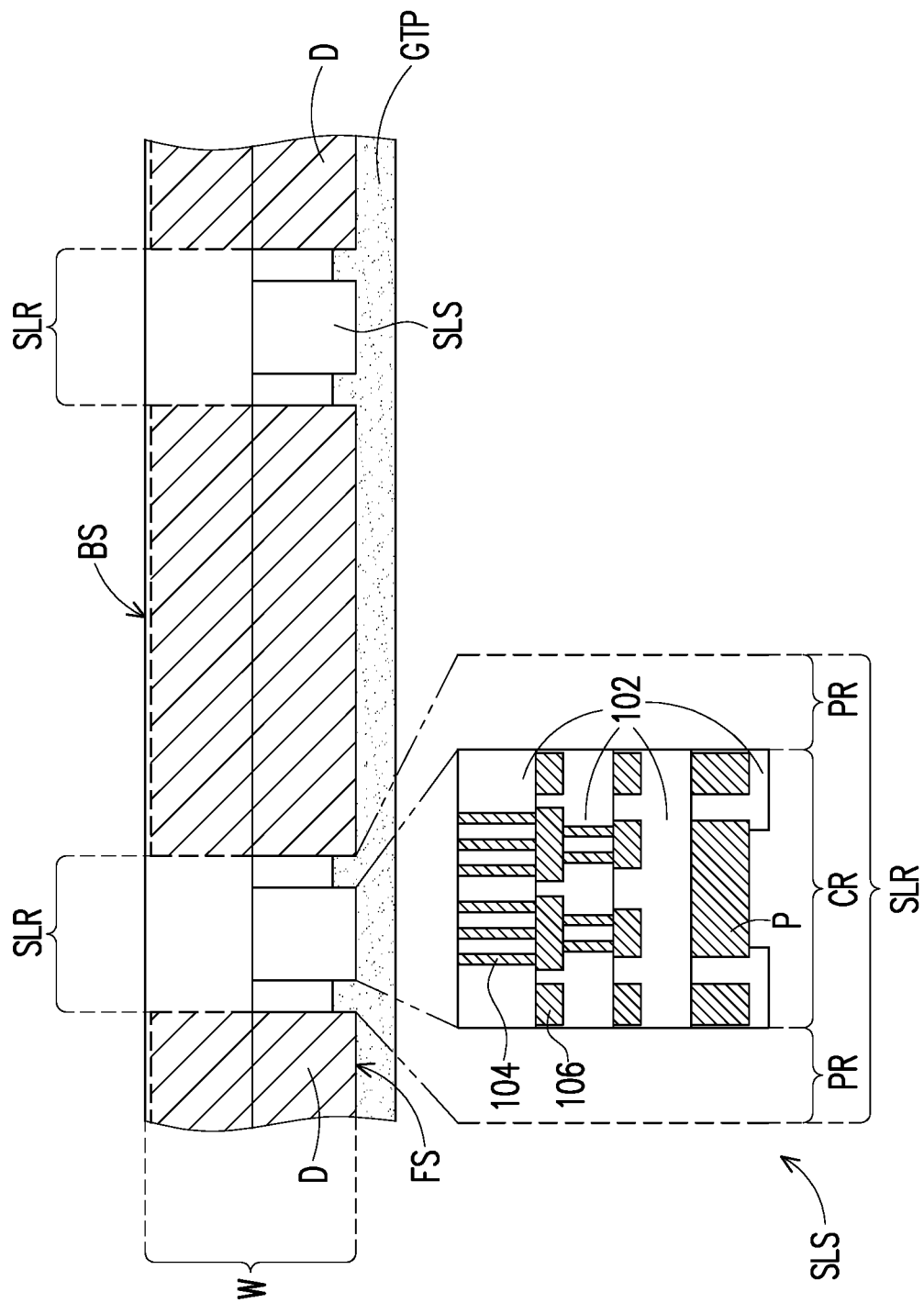

Referring to FIG. 1 and FIG. 2F, in some embodiments, step S106 is performed, and the substrate 100 is thinned from the back side BS of the wafer W. The substrate 100 may be thinned to a predetermined thickness. In some embodiments, this predetermined thickness may be substantially equal to a thickness of a portion of the dies D inside the substrate 100. In some embodiments, a thickness of the thinned substrate 100 may range from 50 μm to 300 μm. In some embodiments, the substrate 100 may be thinned by grinding or other approaches.

Figure 2G:
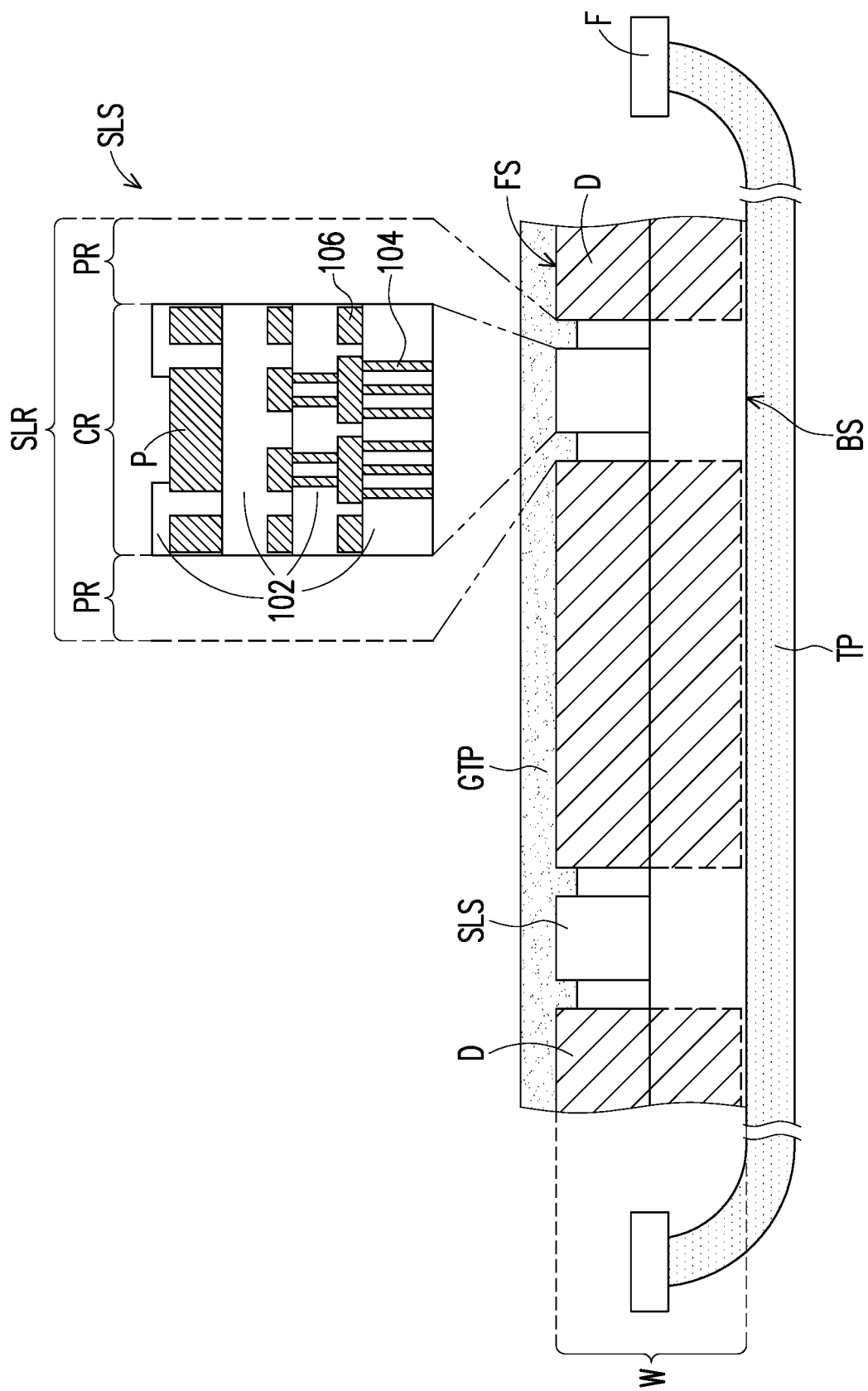

Referring to FIG. 1 and FIG. 2G, in some embodiments, step S108 is performed, and the back side BS of the wafer W is attached with a tape TP. As such, the front side FS of the wafer W is attached with the grinding tape GTP, and the back side BS of the wafer W is attached with the tape TP. In some embodiments, the tape TP is attached with the back side BS of the wafer W after the structure shown in FIG. 2F is turned upside down. In some embodiments, the tape TP is connected with a frame F.

Figure 2H:
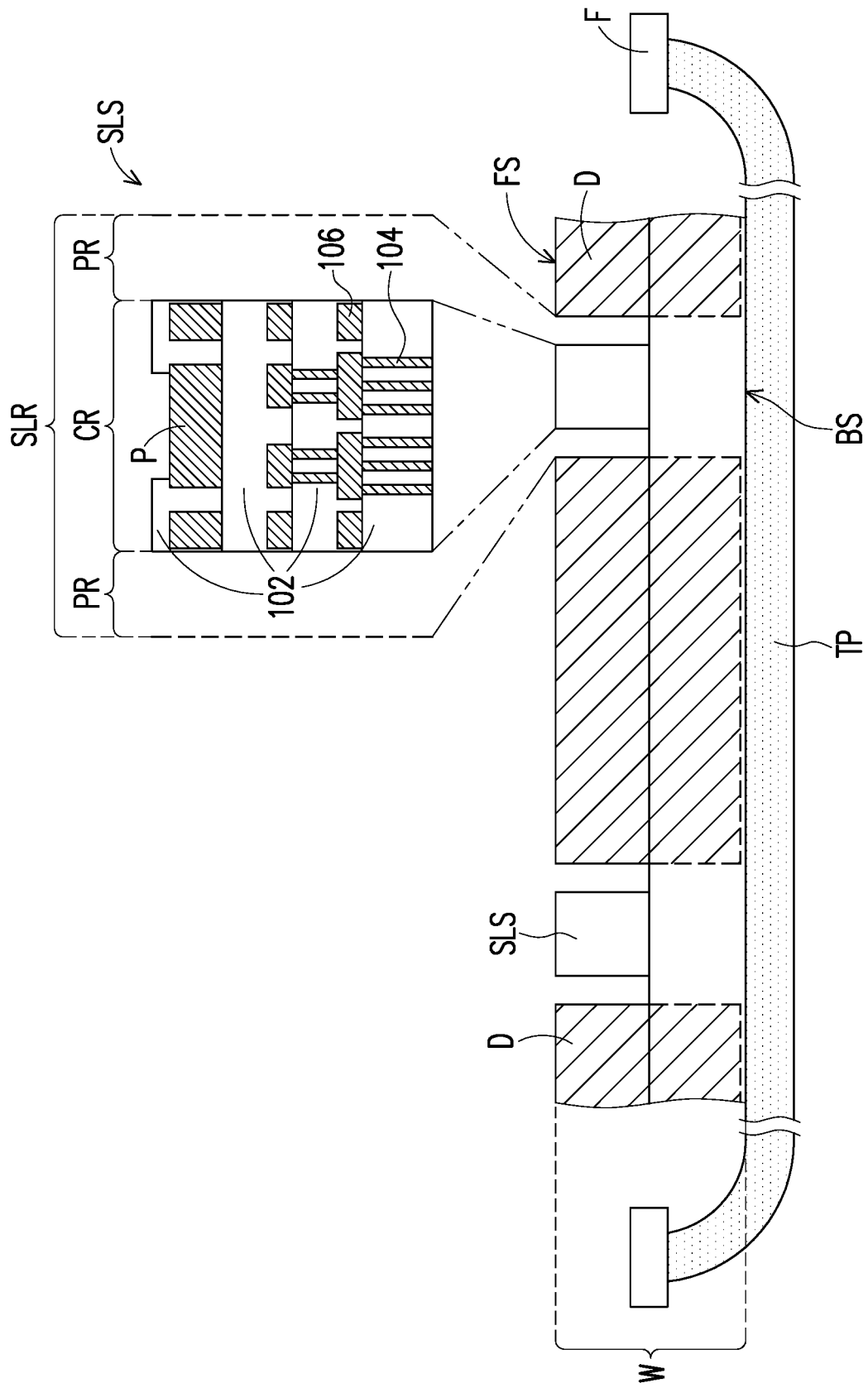

Referring to FIG. 1 and FIG. 2H, in some embodiments, step S110 is performed, and the grinding tape GTP is removed. Therefore, the front side FS of the wafer W can be exposed. That is, the surfaces of the dies D and the remained portion of the scribe line structure SLS are exposed. In some embodiments, a material of the grinding tape GTP includes a photosensitive material. In these embodiments, an adhesiveness of the grinding tape GTP may be reduced by irradiating light, such that the grinding tape GTP can be successfully stripped off from the front side FS of the wafer W.

Figure 2I:
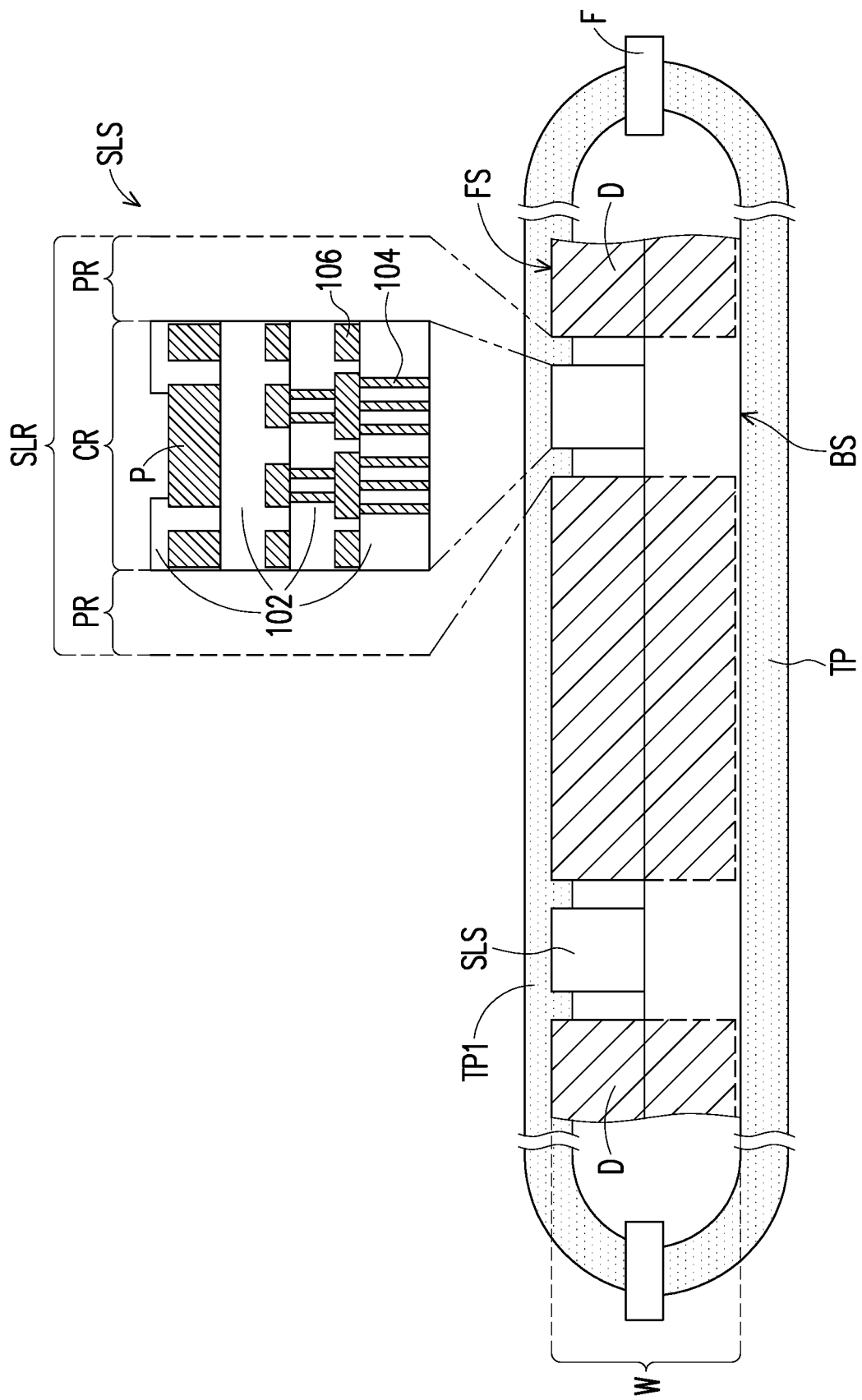

Referring to FIG. 1 and FIG. 2I, step S112 is performed, and the front side FS of the wafer W is attached with a first tape TP1. In some embodiments, the frame F connected with the tape TP attaching to the wafer W may be further connected with the first tape TP1. Currently, the back side BS of the wafer W is attached with the tape TP, whereas the front side FS of the wafer W is attached with the first tape TP1. In other words, the first tape TP1 is in contact with the surfaces of the dies D, and in contact with the remained portion of the scribe line structure SLS (i.e., the portion of the scribe line structure SLS located in the central region CR). In some embodiments, the first tape TP1 may extend into the gap between the remained portion of the scribe line structure SLS and adjacent dies D, and partially fills the gap. In other embodiments, the first tape TP1 may substantially fill up this gap.

Figure 2J:
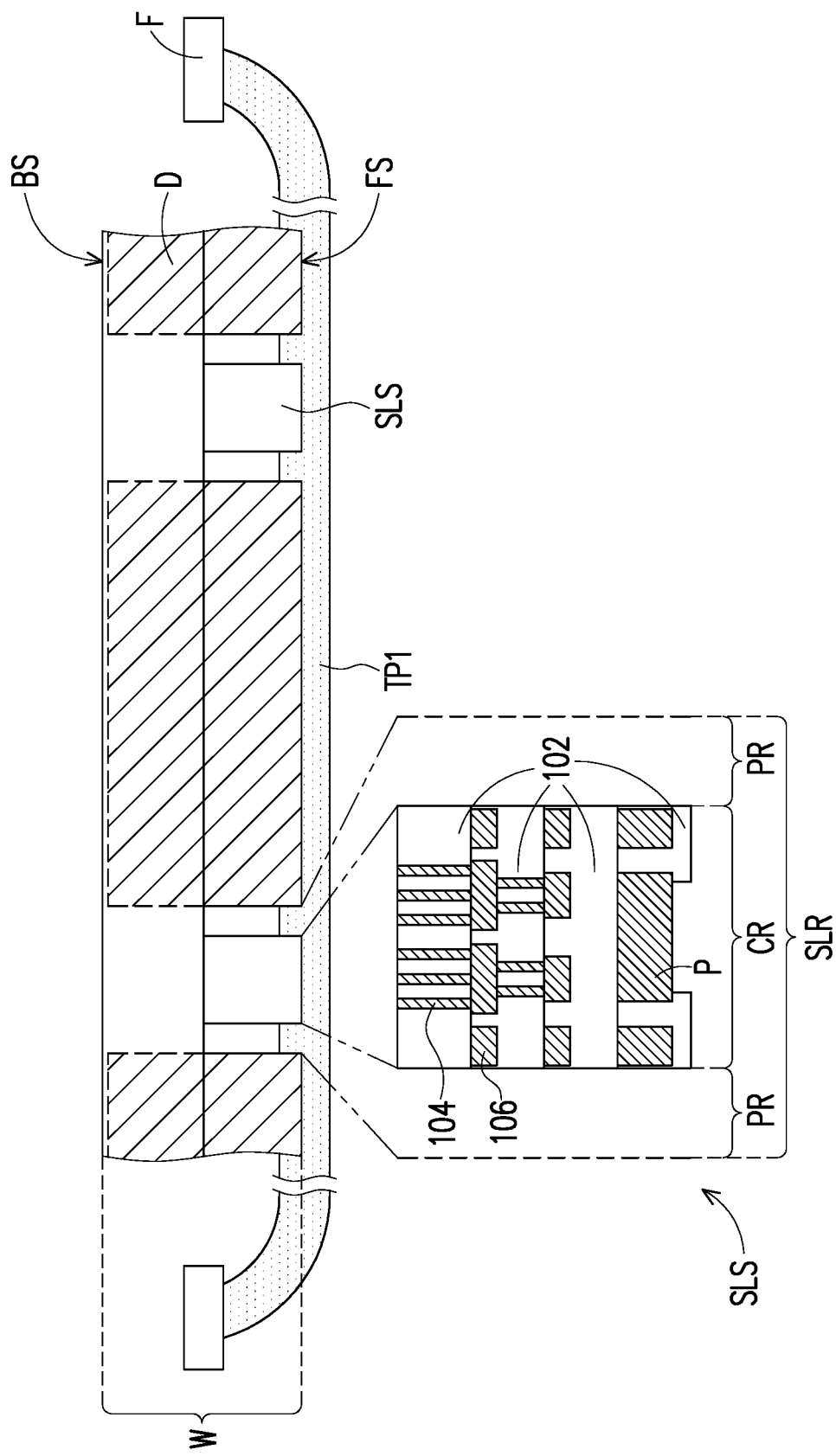

Referring to FIG. 1 and FIG. 2J, in some embodiments, step S114 is performed, and the tape TP is removed. As such, the bask side of the wafer W can be exposed. In some embodiments, a material of the tape TP may include a photosensitive material. In these embodiments, an adhesiveness of the tape TP may be reduced by irradiating light, such that the tape TP can be successfully stripped off from the back side BS of the wafer W. The whole structure may be turned upside down before or after the tape TP is removed, such that the back side BS of the wafer W is facing upwardly.

Referring to FIG. 1 and FIG. 2K through FIG. 2M, step S116 is performed, and a portion of the substrate 100 that is overlapped with the scribe line region SLR is removed from the back side BS of the wafer W. In some embodiments, a method of removing the portion of the substrate 100 that is overlapped with the scribe line region SLR from the back side BS of the wafer W may include sequentially performing sub-step S116a through sub-step S116d.

Figure 2K:
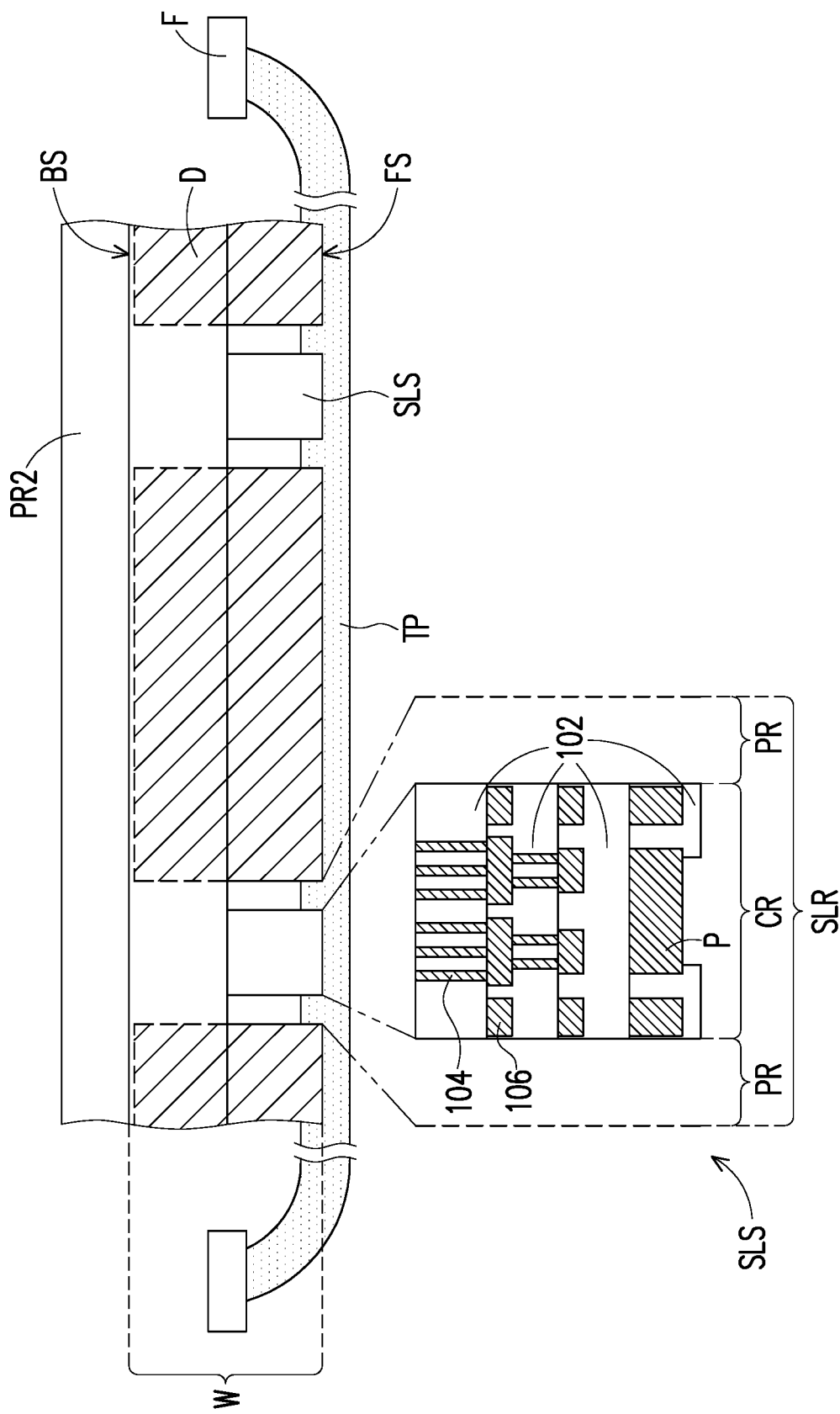

Referring to FIG. 1 and FIG. 2K, sub-step S116a is performed, and a photoresist layer PR2 is formed on the back side BS of the wafer W. In some embodiments, the photoresist layer PR2 may be formed on the back side BS of the wafer W by a method of spray coating. In addition, in some embodiments, substantially the whole bask side BS of the wafer W may be covered by the photoresist layer PR2.

Figure 2L:
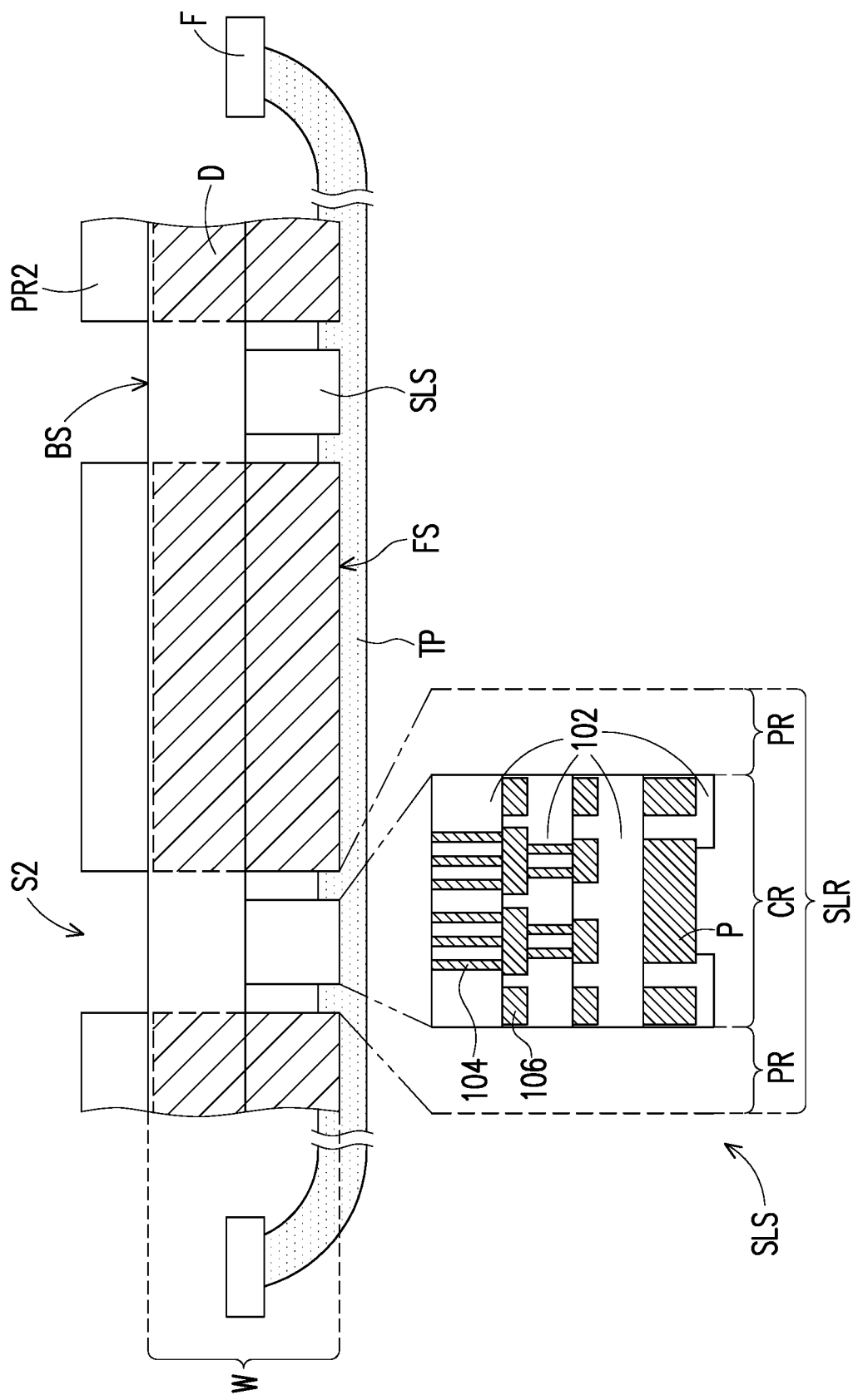

Referring to FIG. 1 and FIG. 2L, sub-step S116b is performed, and the photoresist layer PR2 is patterned. As such, an opening S2 is formed in the photoresist layer PR2. The opening S2 exposes the back side BS of the substrate 100, and is overlapped with the scribe line region SLR. In some embodiments, a sidewall of the opening S2 is substantially aligned with sidewalls of the dies D.

Figure 2M:
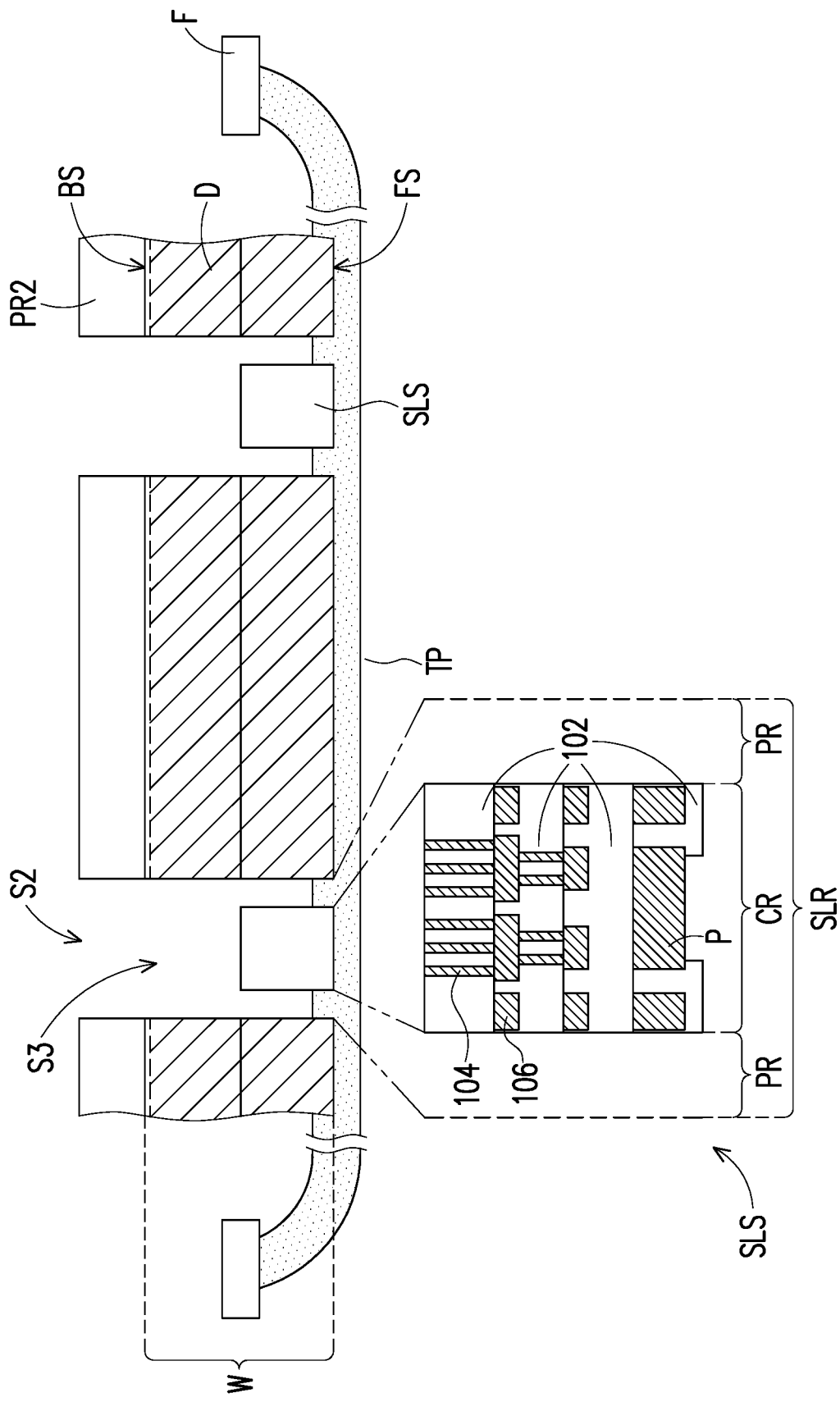

Referring to FIG. 1 and FIG. 2M, sub-step S116c is performed, and the portion of the substrate 100 exposed by the opening S2 is removed by using the patterned photoresist layer PR2 as a mask. In some embodiments, substantially the whole portion of the substrate 100 that is overlapped with the scribe line region SLR is removed, so as to form an opening S3. The opening S3 exposes the portion of the scribe line structure SLS that is located in the central region CR (including the insulating layers 102 and the test device TE). Currently, since the portion of the scribe line structure SLS that is located at opposite sides of the central region CR (i.e., the portion of the scribe line structure SLS located in the peripheral region PR) has been removed, the portion of the scribe line structure SLS located in the central region CR is no longer directly connected with the dies D, but attached with the first tape TP1. In addition, the structures in the scribe line region SLR has been removed or separated from the dies D, thus the dies D can be singulated. In some embodiments, the portion of the substrate 100 exposed by the opening S2 may be removed by a method of plasma dicing. In some embodiments, a process time of the plasma dicing may be adjust, in order to remove substantially the whole portion of the substrate 100 that is overlapped with the scribe line region SLR. In other embodiments, the insulating layer 102 in the scribe line region SLR and farthest from the first tape TP1 may be functioned as a stop layer in the plasma dicing process. In addition, in some embodiments, an etchant (i.e., a reactive gas) of the plasma dicing process includes a sulfur fluoride, but the present invention is not limited thereto.

Figure 2N:
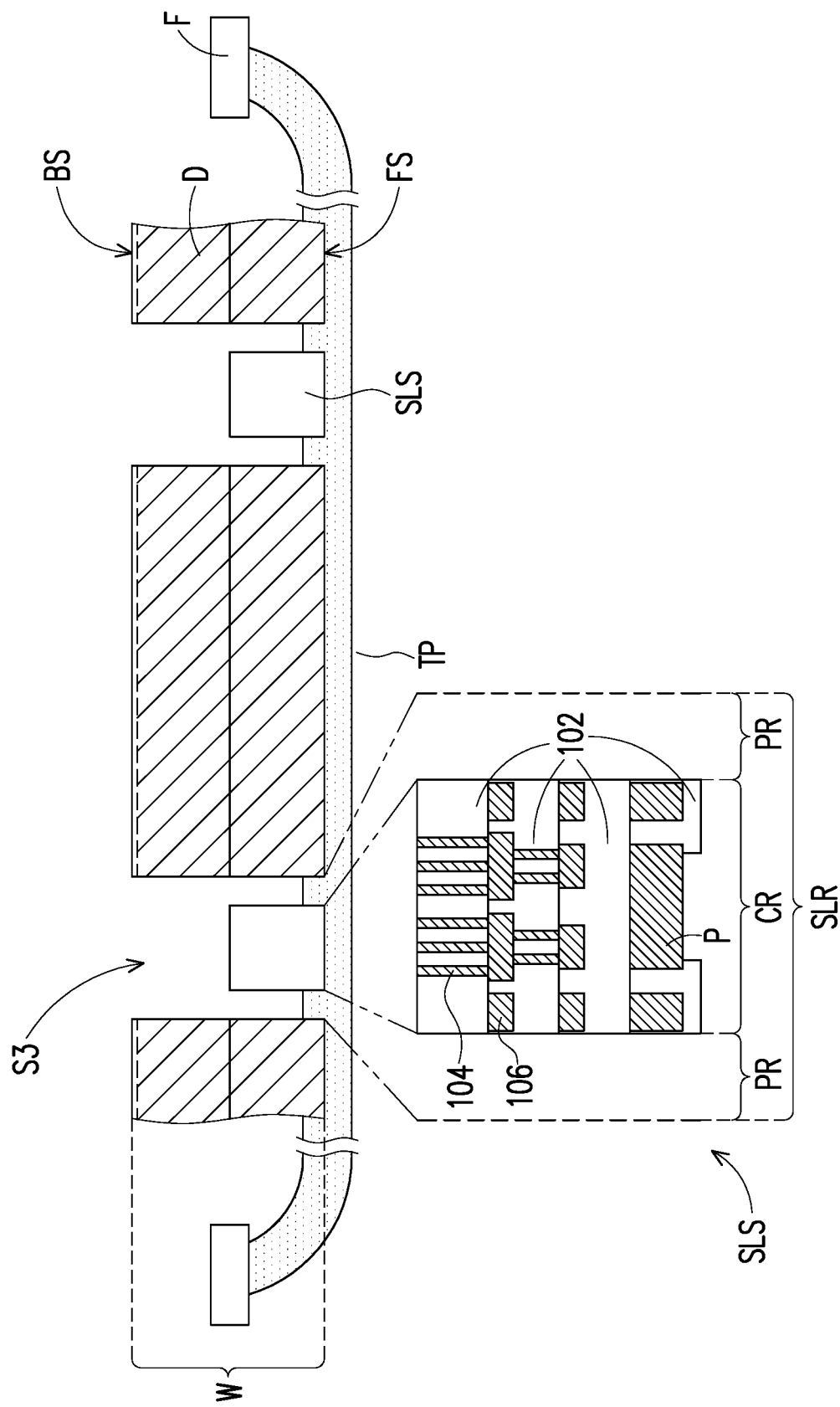
Figure 20:
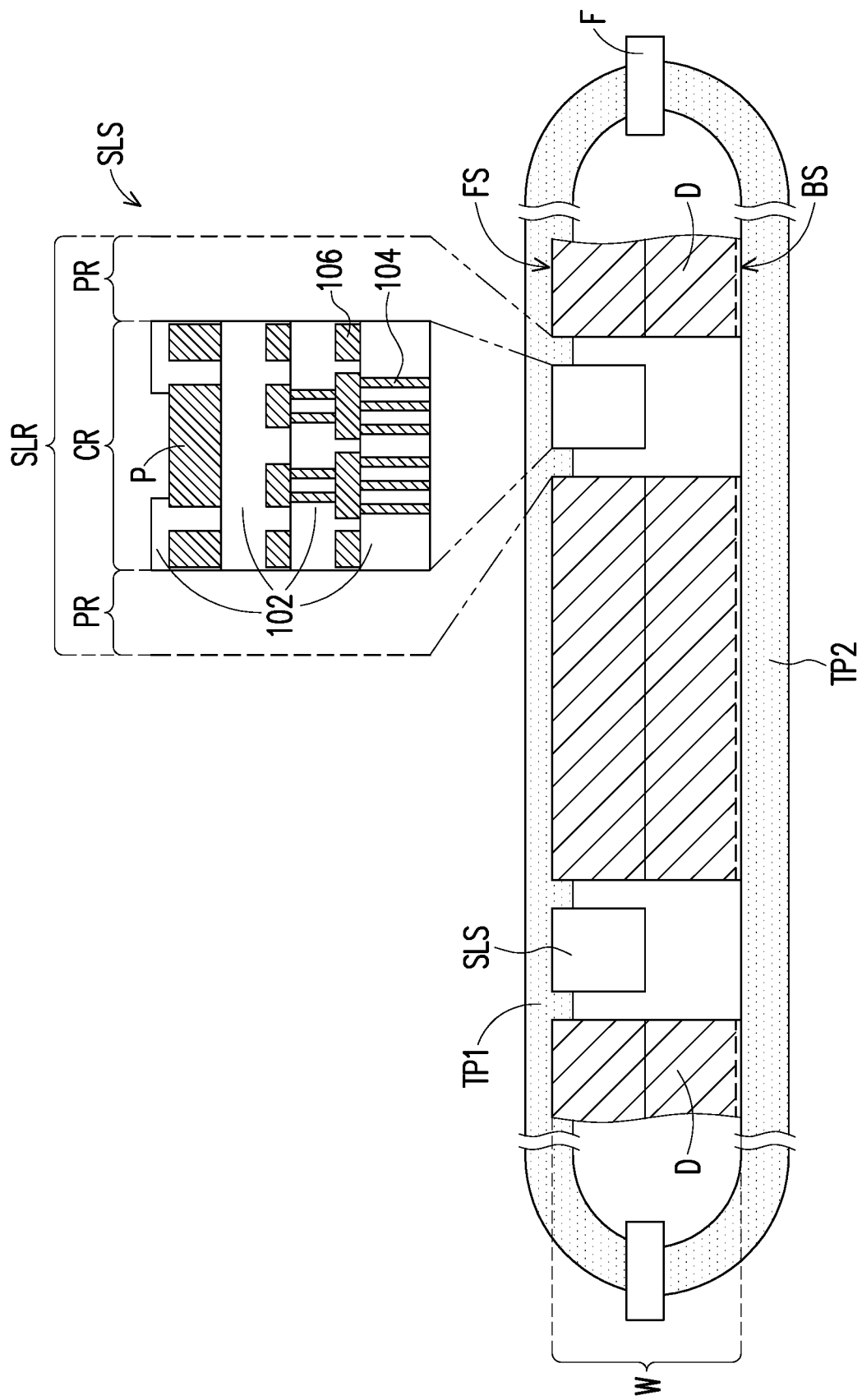
Figure 2P:
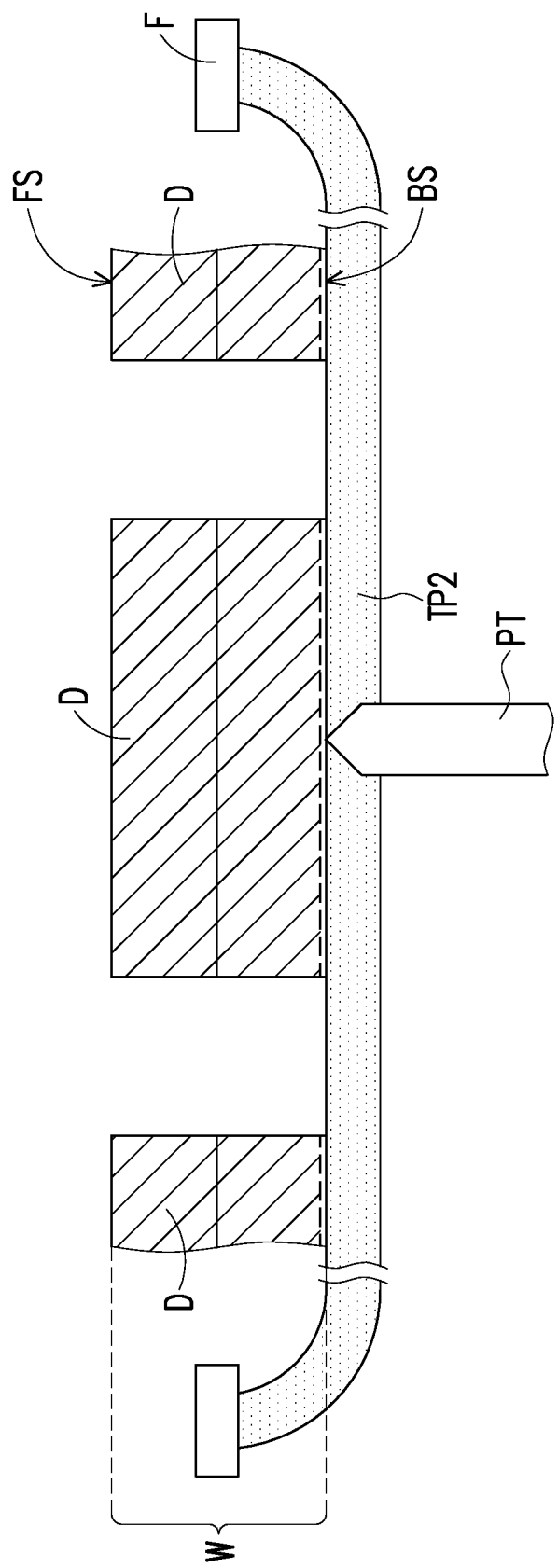

Referring to FIG. 1 and FIG. 2N, sub-step S116d is performed, and the patterned photoresist layer PR2 is removed. As such, substantially the whole backside BS of the wafer W (i.e., the back sides of the dies D) can be exposed. In some embodiments, a method of removing the patterned photoresist layer PR2 may include an ashing process. For instance, a reactive gas for the ashing process includes $O_2$. In other embodiments, the patterned photoresist layer PR2 may be removed by a solution process.

Referring to FIG. 1 and FIG. 2O, step S118 is performed, and the back side BS of the wafer W (i.e., the back sides of the dies D) is attached with a second tape TP2. In some embodiments, the back side BS of the wafer W (i.e., the back sides of the dies D) is attached with the second tape TP2 after the structure shown in FIG. 2N is turned upside down. In some embodiments, the frame F connected with the first tape TP1 attaching to the wafer W may be further connected with the second tape TP2. Currently, the front side FS of the wafer W (including the front sides of the dies D and the surface of the remained portion of the scribe line structure SLS) is still attached to the first tape TP1, and the back side BS of the wafer W (i.e., the back sides of the dies D) is attached to the second tape TP2.

Referring to FIG. 1 and FIG. 2P, step S120 is performed, and the first tape TP1 is removed. The remained portion of the scribe line structure SLS (the portion of the scribe line structure SLS located in the central region CR) is merely attached to the first tape TP1 but not directly connected to the dies D, thus the remained portion of the scribe line structure SLS would be removed along with the first tape TP1. In other words, in step S120, the first tape TP1, the remained portion of the insulating layers 102 attached to the first tape TP1 and the test device TE would be removed. Currently, the dies D separately attached to the second tape TP2 are remained. In some embodiments, a material of the first tape TP1 includes a photosensitive material. In these embodiments, an adhesiveness of the first tape TP1 may be reduced by irradiating light, such that the first tape TP1 can be successfully stripped off from the front side FS of the wafer W.

In some embodiments, the dies D may be took off from the second tape TP2 by a pickup apparatus PT after the first tape TP1 is removed. Those skilled in the art may select an appropriate pickup apparatus according to actual requirement, the present invention is not limited thereto. So far, the method of wafer dicing in some embodiments of the present invention is completed. In addition, the picked dies D may be subjected to a packaging process after the wafer dicing process is completed.

As above, the wafer dicing method of the embodiments in the present invention includes removing the scribe line structure in the scribe line region of the wafer in multiple stages. The scribe line structure is disposed on the substrate, and located between adjacent dies. In a first stage, the portion of the scribe line structure located in the peripheral region, which is surrounding the central region having the test device therein, is removed. Afterwards, in a second stage, the portion of the substrate that is overlapped with the whole scribe line region is removed. Since the portion of the scribe line structure located in the peripheral region and the portion of the substrate overlapped with the whole scribe line region are removed, the remained portion of the scribe line structure (i.e., the portion of the scribe line structure in the central region) can be disconnected from the dies. At this stage, the remained portion of the scribe line structure is merely attached to the tape, but not directly connected with the dies. Eventually, in the third stage, the tape is removed along with the remained portion of the scribe line structure attached to the tape. Therefore, the wafer dicing method of the embodiments in the present invention can avoid from directly removing the test device that may contain the barely etchable metal. Accordingly, the wafer dicing method of the embodiments in the present invention can be suitable for plasma dicing. A process time for singulating the dies by plasma dicing is significantly shorter than a process time for singulating the dies by laser dicing or mechanical dicing. Thus, a manufacturing cost can be greatly lowered.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of wafer dicing, comprising:
providing a wafer, wherein the wafer comprises a substrate, a plurality of dies formed in and over the substrate and a scribe line structure, the scribe line structure is disposed in a scribe line region between adjacent dies, the scribe line structure comprises at least one insulating layer formed over the substrate and a test device formed in the at least one insulating layer;
removing a portion of the at least one insulating layer that is surrounding the test device;
attaching a front side of the wafer with a first tape, wherein the first tape is in contact with the plurality of dies and a remained portion of the at least one insulating layer;
removing a portion of the substrate that is overlapped with the scribe line region from a back side of the wafer;
attaching the back side of the wafer with a second tape; and
removing the first tape along with the remained portion of the at least one insulating layer and the test device attached to the first tape, such that the plurality of dies are separately attached to the second tape.

2. The method of wafer dicing of claim 1, wherein a method of removing the portion of the at least one insulating layer that is surrounding the test device comprises a lithography process and an etching process.

3. The method of wafer dicing of claim 1, before the front side of the wafer is attached with the first tape, further comprising:
attaching a grinding tape to the front side of the wafer;
thinning the substrate from the back side of the wafer; and
removing the grinding tape.

4. The method of wafer dicing of claim 3, before the grinding tape is removed, further comprising: attaching the back side of the wafer with a tape.

5. The method of wafer dicing of claim 4, after the front side of the wafer is attached with the first tape, further comprising: removing the tape.

6. The method of wafer dicing of claim 4, wherein the tape and the first tape are connected to the same frame.

7. The method of wafer dicing of claim 1, wherein a method of removing the portion of the substrate that is overlapped with the scribe line region from the back side of the wafer comprises:
forming a photoresist layer on the back side of the wafer;
patterning the photoresist layer, to form an opening in the photoresist layer, wherein the opening is overlapped with the scribe line region;
removing the portion of the substrate that is exposed via the opening by using the patterned photoresist layer as a mask; and
removing the patterned photoresist layer.

8. The method of wafer dicing of claim 7, wherein a method of removing the portion of the substrate comprises a plasma dicing process.

9. The method of wafer dicing of claim 1, wherein the test device comprises Al.

10. The method of wafer dicing of claim 1, wherein the first tape and the second tape are connected to the same frame.

* * * * *